(12) United States Patent
Sehmbey et al.

(10) Patent No.: US 12,285,929 B2
(45) Date of Patent: Apr. 29, 2025

(54) ELECTRONIC DEVICE WITH THERMALLY INSULATING MATERIAL INSTANCES AND CORRESPONDING METHODS

(71) Applicant: Motorola Mobility LLC, Chicago, IL (US)

(72) Inventors: Maninder S Sehmbey, Hoffman Estates, IL (US); Alberto R Cavallaro, Northbrook, IL (US)

(73) Assignee: Motorola Mobility LLC, Chicago, IL (US)

( * ) Notice: Subject to any disclaimer, the term of this patent is extended or adjusted under 35 U.S.C. 154(b) by 442 days.

(21) Appl. No.: 17/847,780

(22) Filed: Jun. 23, 2022

(65) Prior Publication Data

US 2023/0421675 A1    Dec. 28, 2023

(51) Int. Cl.
| | |
|---|---|
| *B32B 3/00* | (2006.01) |
| *B32B 3/26* | (2006.01) |
| *B32B 27/06* | (2006.01) |
| *H05K 5/02* | (2006.01) |

(52) U.S. Cl.
CPC ............... *B32B 27/06* (2013.01); *B32B 3/266* (2013.01); *H05K 5/0209* (2022.08); *B32B 2250/02* (2013.01); *B32B 2307/206* (2013.01); *B32B 2307/737* (2023.05); *B32B 2457/20* (2013.01)

(58) Field of Classification Search
CPC .......... B32B 7/12; H05K 5/03; H05K 5/0018; H05K 5/0209; H05K 5/0211; H05K 5/0213; H04M 1/0283
See application file for complete search history.

(56) References Cited

U.S. PATENT DOCUMENTS

| | | | |
|---|---|---|---|
| 9,235,299 B2 | 6/2016 | Ady et al. | |
| 10,248,826 B2 | 4/2019 | Slaby et al. | |
| 11,119,544 B1* | 9/2021 | Perez | H05K 7/20154 |
| 2008/0310108 A1* | 12/2008 | Eriksson | H05K 7/20418 361/709 |
| 2013/0271920 A1* | 10/2013 | Chun | H05K 7/2039 361/705 |
| 2015/0005043 A1* | 1/2015 | Shiraishi | G06F 1/1626 455/575.8 |
| 2016/0282915 A1 | 9/2016 | Lombardi et al. | |
| 2018/0348828 A1 | 12/2018 | Cavallaro et al. | |
| 2018/0376619 A1* | 12/2018 | Yang | H04M 1/0202 |
| 2020/0344913 A1 | 10/2020 | Nensel | |
| 2021/0281312 A1 | 9/2021 | Chisu et al. | |

(Continued)

OTHER PUBLICATIONS

JP-3106120-B2 (Kobayashi T) (Year: 2000).*

(Continued)

*Primary Examiner* — Elizabeth E Mulvaney
(74) *Attorney, Agent, or Firm* — Philip H. Burrus, IV

(57) ABSTRACT

An electronic device includes a device housing and heat generating electronics situated within the device housing. A thermally insulating screen defined by thermally insulating material is positioned on an exterior of the device housing. The thermally insulating screen defines a partition between the exterior of the device housing and external objects contacting the electronic device while allowing thermal energy from the heat generating electronics to dissipate through the device housing between instances of the thermally insulating material.

20 Claims, 9 Drawing Sheets

(56) References Cited

U.S. PATENT DOCUMENTS

2021/0288392 A1 9/2021 Xin et al.
2021/0405735 A1 12/2021 Lattrel et al.

OTHER PUBLICATIONS

"A technical evaluation of fingerprint scanners", Copyright 2015; Unknown exact Publication Date but believed to be prior to filing of present application; Viewed online Jun. 6, 2022 at http://www.biometrika.it/eng/wp_scfing.html.
"How to Create Patterns in Illustrator—About Patterns", Published on or before May 16, 2021; Viewed online Jun. 6, 2022 at https://helpx.adobe.com/in/illustrator/using/patterns.html.

* cited by examiner

ELECTRONIC DEVICE WITH THERMALLY INSULATING MATERIAL INSTANCES AND CORRESPONDING METHODS

BACKGROUND

Technical Field

This disclosure relates generally to electronic devices, and more particularly to portable electronic devices.

Background Art

Modern portable electronic devices such as smartphones and tablet devices are powerful computing systems. The processors in these devices are more powerful that the giant supercomputers of just a few decades ago.

As the technology associated with these devices develops, users frequently demand lighter and thinner devices. Housing walls get thinner, as does the available volume within the device. At the same time, the small yet powerful processors within the device generate large amounts of thermal energy when operating at maximum capacity. Excess heat can make the device less than comfortable to handle. It would be advantageous to have an improved electronic device.

BRIEF DESCRIPTION OF THE DRAWINGS

The accompanying figures, where like reference numerals refer to identical or functionally similar elements throughout the separate views and which together with the detailed description below are incorporated in and form part of the specification, serve to further illustrate various embodiments and to explain various principles and advantages all in accordance with the present disclosure.

Figure 1:
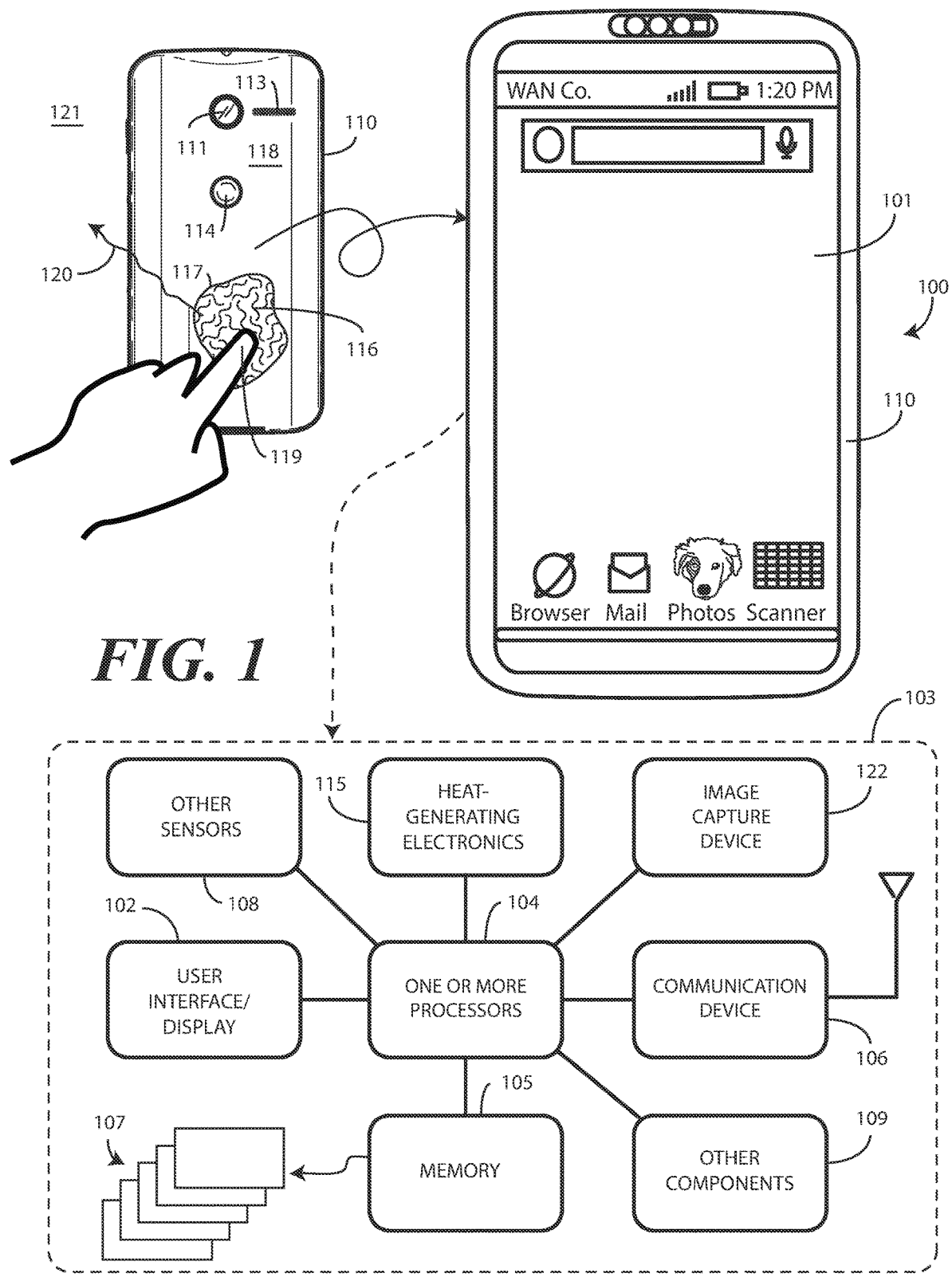
FIG. 1 illustrates one explanatory electronic device in accordance with one or more embodiments of the disclosure.

Skilled artisans will appreciate that elements in the figures are illustrated for simplicity and clarity and have not necessarily been drawn to scale. For example, the dimensions of some of the elements in the figures may be exaggerated relative to other elements to help to improve understanding of embodiments of the present disclosure.

DETAILED DESCRIPTION OF THE DRAWINGS

Before describing in detail embodiments that are in accordance with the present disclosure, it should be observed that the embodiments reside primarily in combinations of method steps and apparatus components related to an electronic device with a thermally insulating screen positioned on the exterior of the device housing and defining a partition between the exterior of the device housing and external objects contacting the electronic device while allowing thermal energy from the heat generating electronics situated within the device housing to dissipate through the device housing between instances of the thermally insulating material. Alternate implementations are included, and it will be clear that functions may be executed out of order from that shown or discussed, including substantially concurrently or in reverse order, depending on the functionality involved. Accordingly, the apparatus components and method steps have been represented where appropriate by conventional symbols in the drawings, showing only those specific details that are pertinent to understanding the embodiments of the present disclosure so as not to obscure the disclosure with details that will be readily apparent to those of ordinary skill in the art having the benefit of the description herein. Further, it is expected that one of ordinary skill, notwithstanding possibly significant effort and many design choices motivated by, for example, available time, current technology, and economic considerations, when guided by the concepts and principles disclosed herein will be readily capable of generating such method steps and apparatus components with minimal experimentation.

Embodiments of the disclosure are now described in detail. Referring to the drawings, like numbers indicate like parts throughout the views. As used in the description herein and throughout the claims, the following terms take the meanings explicitly associated herein, unless the context clearly dictates otherwise: the meaning of "a," "an," and "the" includes plural reference, the meaning of "in" includes "in" and "on." Relational terms such as first and second, top and bottom, and the like may be used solely to distinguish one entity or action from another entity or action without necessarily requiring or implying any actual such relationship or order between such entities or actions. As used herein, components may be "operatively coupled" when information can be sent between such components, even though there may be one or more intermediate or intervening components between, or along the connection path.

The terms "substantially," "essentially," "approximately," "about," or any other version thereof, are defined as being close to as understood by one of ordinary skill in the art, and in one non-limiting embodiment the term is defined to be within ten percent, in another embodiment within five percent, in another embodiment within one percent and in another embodiment within one-half percent. The term "coupled" as used herein is defined as connected, although not necessarily directly and not necessarily mechanically. Also, reference designators shown herein in parenthesis indicate components shown in a figure other than the one in discussion. For example, talking about a device (10) while discussing figure A would refer to an element, 10, shown in figure other than figure A.

As noted above, processors and other components disposed within portable electronic devices, such as smartphones, tablet computers, gaming devices, media players, and so forth, generate a lot of heat. Moreover, these components tend to be very small. Thus, while the amount of heat generated may not be extreme compared to, say, an oven or furnace, the fact that the heat is concentrated in a small location can be problematic. For example, a central processor operating in a smartphone at a maximum level may generate nine watts. If this heat is not dissipated, it can cause damage to the die, surrounding components, or other circuits. Moreover, it can make the device less than comfortable to handle.

For this reason, some manufacturers limit output power of microprocessors and other high output power components in wearable electronic devices. A manufacturer may limit the maximum output power to be generated for a predefined time such as thirty seconds or less. A maximum output power of nine watts might be scaled back to something on the order of four watts after thirty seconds of full performance operation for instance. This prevents damage to the die of the processor or other semiconductor component, as well as protecting the battery chemistry from compromised reliability. The reduction in power also prevents the housing of the device from exceeding the ambient temperature by more than a few degrees centigrade.

The accompanying reduction in performance comes at a cost, namely, that the speed and number of cores in the processor is reduced, thereby causing complex computational tasks to take longer. The user experience is reduced when the device seems to operate slower, despite having the "latest and greatest" processor inside.

Prior art attempts at solving device heating and over-temperature issues include both heat "spreading," which uses graphite sheets, heat pipes, or vapor chambers to try and spread heat across a surface of the electronic device, and heat dissipation using fans or other mechanical devices to cool the electronic device. The problem with these prior art attempts at addressing these problems is that the perceived temperature limits remain the same, but an effort is made to improve the heat transfer to minimize the temperatures of the housing of the device.

Embodiments of the disclosure provide an alternate solution that makes the perceived temperature when touching the electronic device "feel" lower than the actual temperature of the device housing. Advantageously, this allows the heat generating electronics situated within the electronic device to operate at higher temperatures. In one or more embodiments, the texture of the external surface is changed such that its temperature, when touched, is perceived to be lower than the actual temperature of the device housing itself.

In one or more embodiments, an electronic device comprises a device housing and heat generating electronics situated within the device housing. A thermally insulating screen is defined by a thermally insulating material positioned on an exterior of the device housing. The thermally insulating screen defines a partition between the device housing and external objects contacting the electronic device while allowing thermal energy from the heat generating electronics to dissipate through the device housing between instances of the thermally insulating material.

In one or more embodiments, the instances of the thermally insulating material comprise hollow structures positioned on the exterior of the device housing. In one or more embodiments, the instances of the thermally insulating material comprise foam-filled structures positioned on the exterior of the device housing. In one or more embodiments, the thermally insulating material comprises a thermoplastic material.

In one or more embodiments, the thermally insulating material defines an uneven, widely spaced texture situated on the exterior of the device housing. The instances of the thermally insulating material define a screen that functions as a partition between the exterior of the device housing and external objects contacting the electronic device such that when a person touches the surface of the device housing, only a small percentage of the exterior of the device housing contacts the skin. The rest of the skin is suspended above the exterior of the device housing by the instances of the thermally insulating material.

In one or more embodiments, the thermally insulating material is manufactured from a poor conductor of heat, one example of which is a thermoplastic material. In one or more embodiments, the instances of the thermally insulating material are positioned at periodic locations along the exterior of the device housing that are just sufficient to maintain structural integrity of each instance of the thermally insulating material. Due to the combination of one or more of these elements, the conduction of heat from the exterior of the device housing to the user's skin is greatly impeded and only permitted to a fraction of the area of the skin that is touching the environment of the electronic device. As a result, the user perceived temperature of the contacted surface is far lower than the actual temperature of the exterior of the device housing. Advantageously, this allows the heat generating electronics situated within the device housing to operate at significantly higher temperatures without the user feeling any discomfort when touching the electronic device.

In one or more embodiments, the thermally insulating material is configured as a plastic mesh attached to the exterior of the device housing of an electronic device. This type of construction is highly effective in impeding heat transfer from the exterior of the device housing to the contacting skin while, at the same time, allowing thermal dissipation of heat from the exterior of the device housing to the environment via air flow between the instances of the thermally insulating material and also via radiation.

Embodiments of the disclosure contemplate that the human body acts as a limited heat sink that can only absorb and/or dissipate a small amount of heat per unit area per unit time while still keeping the skin temperature stable (homeostasis). However, if the heat transferred to the skin is through a highly conductive material, the rate of heat absorbed by the skin is insufficient to keep the skin temperature (as perceived by the person) low. This is why, when touched, metal feels hotter (or colder if the temperature of the metal is lower than the skin temperature) than plastics at the same temperature. Embodiments of the disclosure take advantage of this by both reducing the thermal conduction and the surface area of contact between the skin and the exterior of the device housing.

In one or more embodiments, the instances of the thermally insulating material are configured as periodic hollow spheres situated along the exterior of the device housing. In another embodiment, the instances of the thermally insulating material are configured as periodic foam-filled spheres. In either embodiment, the periodic spheres are used to minimize conduction from the exterior of the device housing while at the same time providing structural strength to these features.

Accordingly, embodiments of the disclosure provide a textured surface, surface treatment, or surface layer placed upon or integrated into the exterior of the device housing of an electronic device. In one or more embodiments, placement of the instances of the thermally insulating material occurs at random locations. In one or more embodiments, the instances of the thermally insulating material reduce the fraction of a user's skin that touches surfaces of the exterior of the device housing to only a few percent. In one or more embodiments, the effective thermal conductivity of the instances of the thermally insulating material is low due to the geometry and/or materials used. The limited contact area and low conduction path between, for example, a user's touching finger and the exterior of the device housing presents a cooler perceived surface for the user to touch.

In one or more embodiments, an electronic device comprises a device housing and one or more heat generating electronics situated within the device housing. In one or more embodiments, instances of the thermally insulating material are positioned on an exterior of the device housing with a combined height and density function configured to prevent more than ten percent of a finger contacting the instances of the thermally insulating material from contacting the exterior of the device housing. As noted above, the instances of the thermally insulating material can be rigid and randomly positioned. In one or more embodiments, the instances of the thermally insulating material define a lattice.

Turning now to FIG. 1, illustrated therein is one explanatory electronic device 100 configured in accordance with one or more embodiments of the disclosure. The electronic device 100 of FIG. 1 is a portable electronic device. For illustrative purposes, the electronic device 100 is shown as a smartphone. However, the electronic device 100 could be any number of other devices as well, including tablet computers, desktop computers, notebook computers, and so forth. Still other types of conferencing system terminal devices can be configured in accordance with one or more embodiments of the disclosure as will be readily appreciated by those of ordinary skill in the art having the benefit of this disclosure.

This illustrative electronic device 100 includes a display 101, which may optionally be touch sensitive. In one embodiment where the display 101 is touch-sensitive, the display 101 can serve as a primary user interface 102 of the electronic device 100. Users can deliver user input to the display 101 of such an embodiment by delivering touch input from a finger, stylus, or other objects disposed proximately with the display 101.

In one embodiment, the display 101 is configured as an active-matrix organic light emitting diode (AMOLED) display. However, it should be noted that other types of displays, including liquid crystal displays, would be obvious to those of ordinary skill in the art having the benefit of this disclosure. Where the electronic device 100 is configured with a keyboard and/or mouse, such as when the electronic device 100 is configured as a computer, the keyboard and/or mouse can serve as the primary user interface 102.

In one or more embodiments, the electronic device 100 includes a device housing 110. The device housing 110 can include one or more housing portions, such as a first housing portion and a second housing portion. In this illustrative embodiment, the device housing 110 is disposed about the periphery of a display 101, thereby defining a major face of the electronic device 100.

In one or more embodiments, the device housing 110 is manufactured from a rigid material such as a rigid thermoplastic, metal, or composite material, although other materials can be used as well. Still other constructs will be obvious to those of ordinary skill in the art having the benefit of this disclosure. While the illustrative electronic device 100 of FIG. 1 includes a single device housing 110, in other embodiments a first device housing can be coupled to a second device housing by a hinge such that the first device housing is pivotable about the hinge relative to the second device housing between an axially displaced open position and a closed position like a clamshell.

In other embodiments, the electronic device 100 will be bendable, but will not include a hinge. Illustrating by example, the device housing 110 can be manufactured from bendable materials.

In still other embodiments, the electronic device 100 can be bendable via a combination of hinge components and non-hinge components. Illustrating by example, in another embodiment the electronic device 100 of FIG. 1 includes a single, flexible device housing. In one embodiment, the device housing 110 may be manufactured from a malleable, bendable, or physically deformable material such as a flexible thermoplastic, flexible composite material, flexible fiber material, flexible metal, organic or inorganic textile or polymer material, or other materials. The device housing 110 could be formed from a single flexible housing member or from multiple flexible housing members. In other embodiments, the device housing 110 could be a composite of multiple components. For instance, in another embodiment the device housing 110 could be a combination of rigid segments connected by hinges or flexible materials. Still other constructs will be obvious to those of ordinary skill in the art having the benefit of this disclosure.

Features can be incorporated into the device housing 110. Examples of such features include imager 111, which in this embodiment is an exterior and rear facing imager. The imager 111, which can be any number of types of image capture devices, has its lens situated such that it is directed away from a user who is holding the electronic device 100 and facing the display 101. This allows the imager 111 to receive light directed toward the electronic device 100 from a location in front of the user when the user is holding the electronic device 100 and facing the display 101.

Instead of, or alternatively in addition to, the imager 111, a second, rear facing imager 112 can be positioned on the interior side of the electronic device 100 to receive light and images directed toward the display 101. When a user is holding the electronic device 100 and looking at the display 101, this second, rear facing imager 112 can be used to take a selfie without turning the electronic device 100 around. While two imagers are shown in the illustrative embodiment of FIG. 1, it should be noted that embodiments of the disclosure can include additional imagers mounted in different positions that can be actuated to capture images from different angles.

Other examples of features that can be incorporated into the device housing 110 include an optional speaker port 113. While shown situated on the rear of the electronic device 100 in FIG. 1, the optional speaker port 113 could also be placed on the front side as well. In this illustrative embodiment, a user interface component 114, which may be a button or touch sensitive surface, can also be disposed along the rear side of the device housing 110. As noted, any of these features shown being disposed on the rear side of the electronic device 100 could be located elsewhere, such as on the front side or minor sides in other embodiments.

Figure 6:
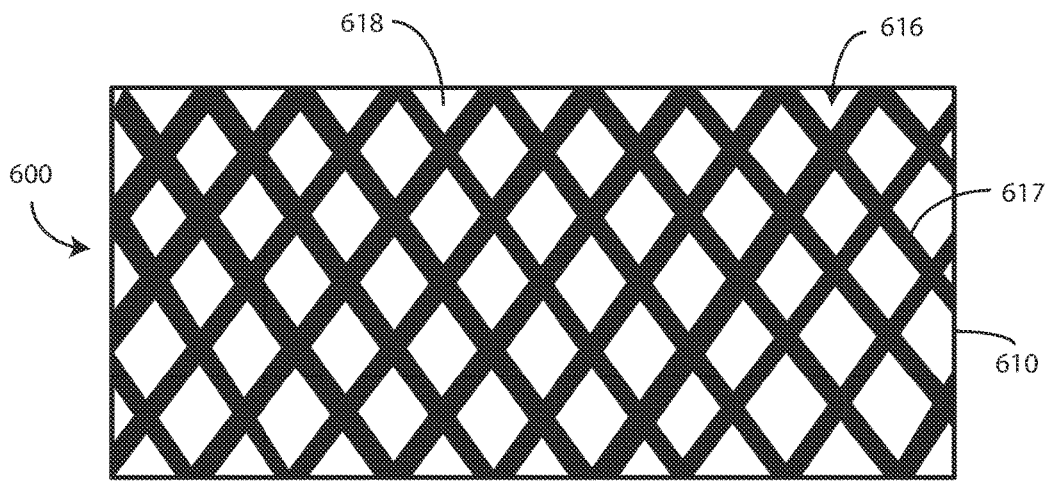
FIG. 6 illustrates a plan view of another explanatory device housing and screen in accordance with one or more embodiments of the disclosure.

A block diagram schematic 103 of the electronic device 100 is also shown in FIG. 6. The block diagram schematic 103 can be configured as a printed circuit board assembly disposed within the device housing of the electronic device 100. Various components can be electrically coupled together by conductors, or a bus disposed along one or more printed circuit boards.

In one or more embodiments, the electronic device 100 includes one or more processors 104. In one embodiment, the one or more processors 104 can include an application processor and, optionally, one or more auxiliary processors. One or both of the application processor or the auxiliary processor(s) can include one or more processors. One or both of the application processor or the auxiliary processor(s) can be a microprocessor, a group of processing components, one or more ASICs, programmable logic, or other type of processing device.

The application processor and the auxiliary processor(s) can be operable with the various components of the electronic device 100. Each of the application processor and the auxiliary processor(s) can be configured to process and execute executable software code to perform the various functions of the electronic device 100. A storage device, such as memory 105, can optionally store the executable software code used by the one or more processors 104 during operation.

The electronic device 100 also includes a communication device 106 that can be configured for wired or wireless communication with one or more other devices or networks. The networks can include a wide area network, a local area network, and/or personal area network. The communication device 106 may also utilize wireless technology for communication, such as, but are not limited to, peer-to-peer or ad hoc communications such as HomeRF, Bluetooth and IEEE 802.11, and other forms of wireless communication such as infrared technology. The communication device 106 can include wireless communication circuitry, one of a receiver, a transmitter, or transceiver, and one or more antennas.

In one embodiment, the one or more processors 104 can be responsible for performing the primary functions of the electronic device 100. For example, in one embodiment the one or more processors 104 comprise one or more circuits operable with one or more user interface devices, which can include the display 101, to engage in electronic communication with other electronic devices by transmitting, receiving, and presenting images, video, or other presentation information. The executable software code used by the one or more processors 104 can be configured as one or more modules 107 that are operable with the one or more processors 104. Such modules 107 can store instructions, control algorithms, logic steps, and so forth.

In one embodiment, the one or more processors 104 are responsible for running the operating system environment of the electronic device 100. The operating system environment can include a kernel and one or more drivers, and an application service layer, and an application layer. The operating system environment can be configured as executable code operating on one or more processors or control circuits of the electronic device 100. The application layer can be responsible for executing application service modules. The application service modules may support one or more applications or "apps." The applications of the application layer can be configured as clients of the application service layer to communicate with services through application program interfaces (APIs), messages, events, or other inter-process communication interfaces. Where auxiliary processors are used, they can be used to execute input/output functions, actuate user feedback devices, and so forth.

In one embodiment, the one or more processors 104 may generate commands or execute control operations based upon user input received at the user interface 102. Moreover, the one or more processors 104 may process the received information alone or in combination with other data, such as the information stored in the memory 105.

The electronic device 100 can include one or more sensors 108. The one or more sensors 108 may include a microphone, an earpiece speaker, and/or a second loudspeaker. The one or more other sensors 108 may also include touch actuator selection sensors, proximity sensors, a touch pad sensor, a touch screen sensor, a capacitive touch sensor, and one or more switches. Touch sensors may used to indicate whether any of the user actuation targets present on the display 101, including the audio difficulties user actuation targets described above, are being actuated. The other sensors 108 can also include audio sensors and video sensors (such as a camera).

Other components 109 operable with the one or more processors 104 can include output components such as video outputs, audio outputs, and/or mechanical outputs. Examples of output components include audio outputs such as speaker port, earpiece speaker, or other alarms and/or buzzers and/or a mechanical output component such as vibrating or motion-based mechanisms. Still other components will be obvious to those of ordinary skill in the art having the benefit of this disclosure.

The other components 109 can also include an audio input/processor. The audio input/processor can include hardware, executable code, and speech monitor executable code in one embodiment. The audio input/processor can include, stored in memory 105, basic speech models, trained speech models, or other modules that are used by the audio input/processor to receive and identify voice commands that are received with audio input captured by an audio input/processor, one example of which is a microphone of the one or more sensors 108. In one embodiment, the audio input/processor can include a voice recognition engine. Regardless of the specific implementation utilized in the various embodiments, the audio input/processor can access various speech models to identify speech commands in one or more embodiments.

In one or more embodiments the electronic device 100 includes an imager 122 or another image capture device. The electronic device 100 can optionally include a depth imager as well.

In one embodiment, the imager 122 comprises a two-dimensional imager configured to receive at least one image of a person within an environment of the electronic device 100. In one embodiment, the imager 122 comprises a two-dimensional RGB imager. In another embodiment, the imager 122 comprises an infrared imager. Other types of imagers suitable for use as the imager 122 of the electronic device 100 will be obvious to those of ordinary skill in the art having the benefit of this disclosure.

These various hardware components, in operation, can generate a lot of heat. Illustrating by example, the one or more processors 104 and other components constitute heat generating electronics 115 that generate heat when performing the operations of the electronic device 100. Accordingly, in one or more embodiments a thermally insulating screen 116 is defined by a thermally insulating material 117 positioned on an exterior 118 of the device housing 110. As used herein, the term "screen" takes the well understood, plain English definition of being a "fixed partition used touch input give shelter from heat" as defined by the New Oxford American Dictionary.

As such, the thermally insulating screen 116 defines a partition between the exterior 118 of the device housing 110 and objects, e.g., finger 119, contacting the electronic device 100 while allowing thermal energy 120 from the heat generating electronics 115 to dissipate through the device housing 110 to the environment 121 of the electronic device between instances of the thermally insulating material 117. In one or more embodiments, the instances of the thermally insulating material 117 positioned on the exterior 118 of the device housing 110 have a combined height and density function configured to prevent more than ten percent of the finger 119 contacting the instances of the thermally insulating material 117 from contacting the exterior 118 of the device housing 110 of the electronic device 100.

In one or more embodiments, the instances of the thermally insulating material 117 are rigid. Illustrating by example, in one or more embodiments the instances of the thermally insulating material 117 are manufactured from a thermoplastic material. In one or more embodiments, the instances of the thermally insulating material 117 are randomly positioned. In one or more embodiments, the instances of the thermally insulating material 117 define a lattice precluding portions of the finger 119 from touching the exterior 118 of the device housing 110 of the electronic device 100.

In one or more embodiments, the instances of the thermally insulating material 117 are selectively positioned along the exterior 118 of the device housing 110 of the electronic device 100. Illustrating by example, in the explanatory embodiment of FIG. 1 the instances of the thermally insulating material 117 are positioned only atop the one or more processors 104 since they are the hottest component of the block diagram schematic 103. In other embodiments, examples of which will be described below with reference to FIGS. 3, the instances of the thermally insulating material 117 can be placed along an entirety of the exterior 118 of the device housing 110.

Embodiments of the disclosure contemplate that in some instances only a subset of components, e.g., the one or more processors 104 or the communication device 106, will generate large amounts of thermal energy. Accordingly, the placement of the instances of the thermally insulating material 117 and or the shape of the thermally insulating screen 116 can be such that the instances of the thermally insulating material 117 are collocated with a particular components of the electronic device 100. For example, in one or more embodiments the thermally insulating screen 116 is positioned atop the location where a particular heat generating electronic particular component is situated for optimal protection of the finger 119.

It is to be understood that FIG. 1 is provided for illustrative purposes only and for illustrating components of one electronic device 100 in accordance with embodiments of the disclosure and is not intended to be a complete schematic diagram of the various components required for an electronic device. Therefore, other conferencing system terminal devices in accordance with embodiments of the disclosure may include various other components not shown in FIG. 1 or may include a combination of two or more components or a division of a particular component into two or more separate components, and still be within the scope of the present disclosure.

Figure 2:
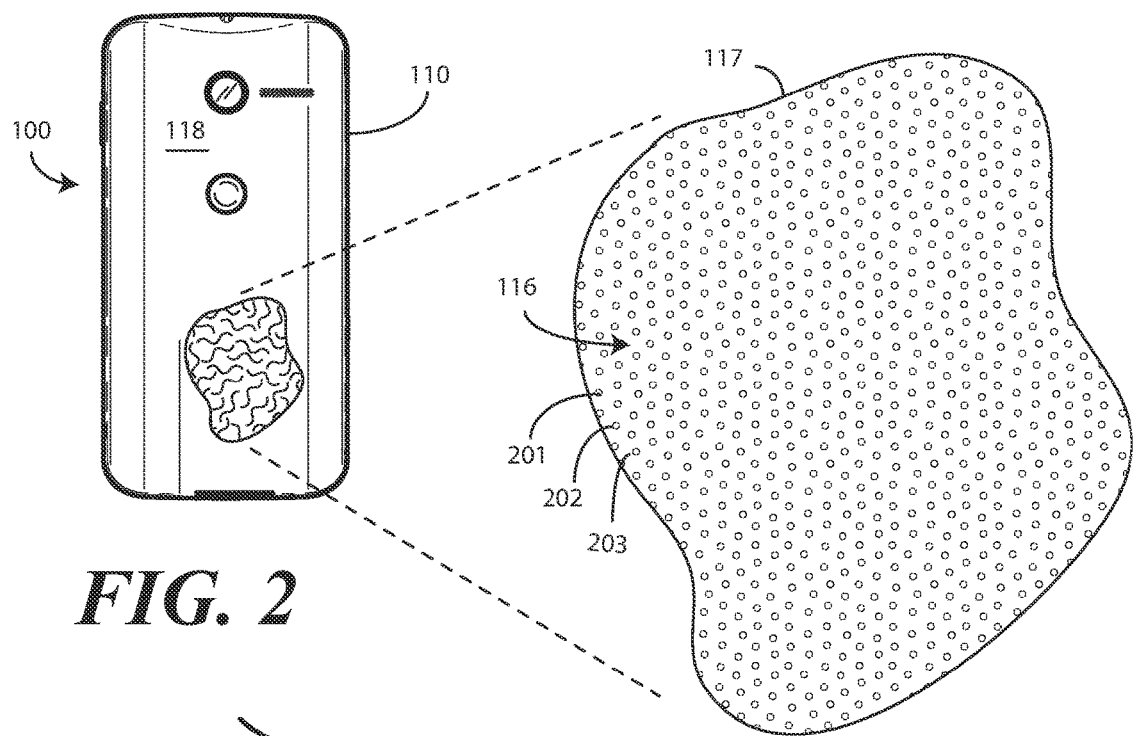
FIG. 2 illustrates one explanatory screen on an electronic device in accordance with one or more embodiments of the disclosure.
Figure 3:
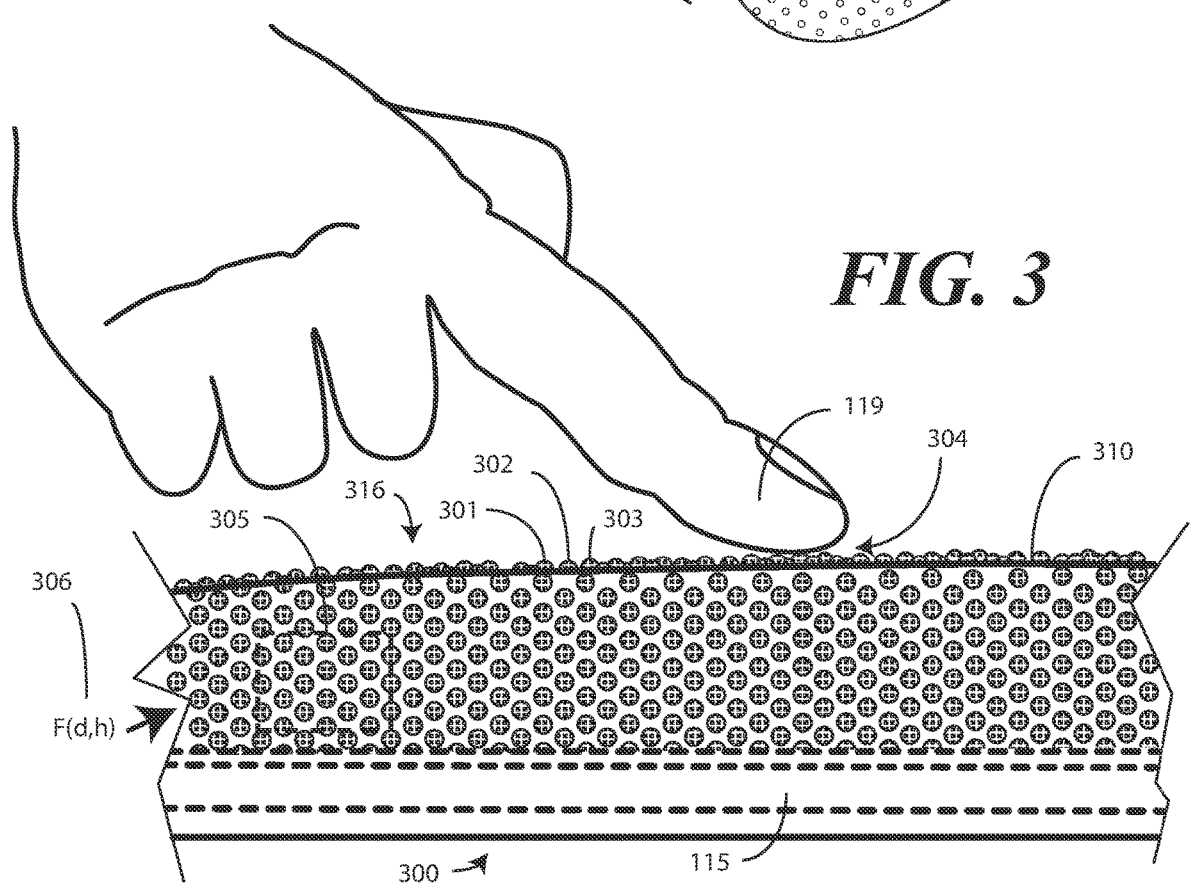
FIG. 3 illustrates a magnified side view of one explanatory electronic device having a screen disposed along the device housing in accordance with one or more embodiments of the disclosure.

Before turning to FIGS. 2-12, it should be noted that various examples and alternatives are illustrated and described with reference to these figures. Illustrating by example, FIG. 2 illustrates selective positioning of the thermally insulating screen defined by the instances of the thermally insulating material, while FIG. 3 shows the entire device housing covered by the instances of the thermally insulating material. It should be understood that the various examples and alternatives from different figures can be used in combination unless they are mutually exclusive. Thus, while the instances of the thermally insulating material shown in FIG. 9 are selectively positioned on the exterior of the device housing, they could be positioned across the entirety of the device housing in accordance with the alternative found in FIG. 3. Similarly, while the instances of the thermally insulating material of FIG. 2 comprise foam-filled structures of thermoplastic material and the instances of the thermally insulating material of FIG. 4 comprise hollow structures, a combination of these can be used in another embodiment. Accordingly, the various examples and alternatives shown in FIGS. 2-12 can be "mixed and matched" unless there is a mutual exclusivity for a particular combination. Thus, not every feature is shown in every figure, but those of ordinary skill in the art having the benefit of this disclosure will recognize that one feature from one figure can be combined with another feature of another figure to create another embodiment, and so forth.

Turning now to FIG. 2, illustrated therein are additional details of the thermally insulating screen 116 of FIG. 1. The thermally insulating screen 116 is defined by one or more instances 201,202,203 of the thermally insulating material 117 that are situated on an exterior 118 of the device housing 110. In this illustrative embodiment the instances 201,202, 203 of the thermally insulating material 117 are periodically positioned along the exterior 118 of the device housing 110. In other embodiments, one example of which will be described below with reference to FIG. 10, the instances 201,202,203 of the thermally insulating material 117 can be positioned randomly along the exterior 118 of the device housing 110.

In the illustrative embodiment of FIG. 2, each instance 201,202,203 of the thermally insulating material 117 comprises a foam-filled structure of thermoplastic material. In the illustrative embodiment of FIG. 2, each foam-filled structure of thermoplastic material are half domes. However, in other embodiments they can take other shapes as well. Illustrating by example, each instance 201,202,203 of the thermally insulating material 117 can be rectangular, triangular, polygonal, rod-shaped, free form shaped, or combinations thereof. Other shapes will be obvious to those of ordinary skill in the art having the benefit of this disclosure.

Turning now to FIG. 3, illustrated therein is another electronic device 300 configured in accordance with embodiments of the disclosure. As shown, the electronic device 300 comprises a device housing 310 that has heat generating electronics 115 situated therein. A thermally insulating screen 316 defined by a thermally insulating material is positioned along an exterior of the device housing 310. In this illustrative embodiment, the thermally insulating screen 316 of thermally insulating material is positioned along an entirety of the exterior of the device housing 310.

In this illustrative embodiment, the instances 301,302,303 of the thermally insulating material are rigid structures manufactured from a thermoplastic material that does not compress when the finger 119 contacts the instances 301, 302,303 of the thermally insulating material. However, in other embodiments the instances 301,302,303 of the thermally insulating material will be compressible and will expand when the finger 119 contacts the instances 301,302, 303 of the thermally insulating material. Other configurations for the instances 301,302,303 of the thermally insulating material will be obvious to those of ordinary skill in the art having the benefit of this disclosure.

As also shown, the thermally insulating screen 316 of thermally insulating material defines a partition 304 between the exterior of the device housing 310 and external objects, one examples of which is the finger 119 of FIG. 3, from contacting the electronic device 300 while simultaneously allowing thermal energy 120 from the heat generating electronics 115 to dissipate through the device housing 310 to an environment of the electronic device 300 between instances 301,302,303 of the thermally insulating material.

In the illustrative embodiment of FIG. 3, the instances 301,302,303 of the thermally insulating material have a density exposing less than ten percent of the exterior of the device housing 310 per each 0.2 square inch area 305 of the device housing 310. The instances 301,302,303 of the thermally insulating material also have a height that, when combined with the density to achieve a combined height and density function 306, prevent more than ten percent of the finger 119 contacting the instances 301,302,303 of the thermally insulating material from contacting the exterior of the device housing 310. The net effect of this combined height and density function 306 is that the exterior of the device housing 310 "feels" cooler than its actual temperature. This allows the heat generating electronics 115 to run hotter without the exterior of the device housing 310 feeling uncomfortably warm to the finger 119.

Figure 4:
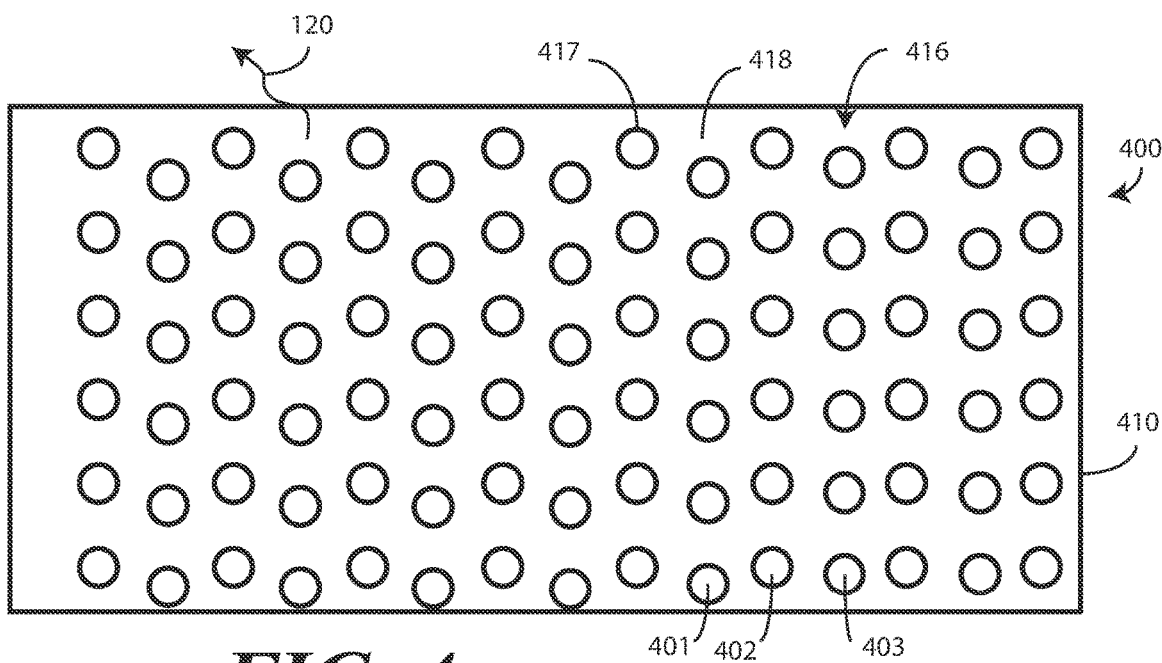
FIG. 4 illustrates a plan view of one explanatory device housing and screen in accordance with one or more embodiments of the disclosure.
Figure 5:
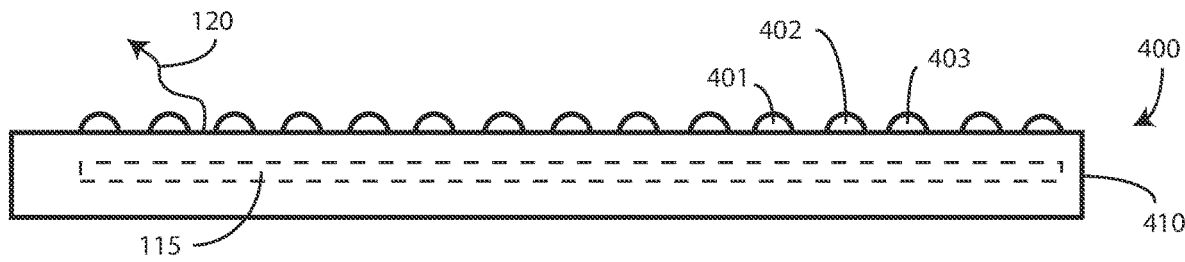
FIG. 5 illustrates a side elevation view of the device housing and screen of FIG. 4.

Turning now to FIGS. 4-5, illustrated therein is another electronic device 400 configured in accordance with embodiments of the disclosure. FIG. 4 illustrates a plan view of the electronic device 400, while FIG. 5 illustrates a side elevation view of the device housing 410.

As before, the electronic device 400 comprises a device housing 410 with heat generating electronics 115 situated therein. A thermally insulating screen 416 of thermally insulating material 417 is positioned on an exterior 418 of the device housing 410. In this illustrative embodiment, the thermally insulating screen 416 of thermally insulating material 417 is only positioned on the rear major surface of the electronic device 400. As shown in FIG. 5, the sides of the device housing 410 of the electronic device 400 include no instances of the thermally insulating material. (The bottom of FIG. 5 is a major face defined by a display of the electronic device 400).

As before, the thermally insulating screen 416 defines a partition between the exterior 418 of the device housing 410 an external object contacting the electronic device 400 while allowing thermal energy 120 to dissipate through the device housing 410 between instances 401,402,403 of the thermally insulating material 417. In the illustrative embodiment of FIG. 4, the instances 401,402,403 of the thermally insulating material 417 comprise hollow structures positioned on the exterior 418 of the device housing 410. In this illustrative embodiment, the instances 401,402,403 of the thermally insulating material 417 each define a partial sphere of hollow thermoplastic material. The instances 401,402,403 of the thermally insulating material 417 are selectively positioned along the exterior 418 of the device housing 410 so as to be situated atop the heat generating electronics 115.

The instances 401,402,403 of the thermally insulating material 417 of FIG. 4 make the perceived temperature when touching the electronic device 400 "feel" lower than the actual temperature of the device housing 410. Advantageously, this allows the heat generating electronics 115 situated within the electronic device 400 to operate at higher temperatures. In one or more embodiments, the instances 401,402,403 of the thermally insulating material 417 change the texture of the exterior 418 of the device housing 410 such that its temperature, when touched, is perceived to be lower than the actual temperature of the device housing 410 itself.

As shown in FIG. 4, the instances 401,402,403 of the thermally insulating material 417 define an uneven, widely spaced texture situated on the exterior 418 of the device housing 410. The instances 401,402,403 of the thermally insulating material 417 define a thermally insulating screen 416 that functions as a partition between the exterior 418 of the device housing 410 and external objects contacting the electronic device 400 such that when a person touches the surface of the device housing 410, only a small percentage of the exterior 418 of the device housing 410 contacts the skin. The rest of the skin is suspended above the exterior 418 of the device housing 410 by the instances 401,402,403 of the thermally insulating material 417.

In one or more embodiments, the thermally insulating material 417 is manufactured from a poor conductor of heat, one example of which is a thermoplastic material. In one or more embodiments, instances 401,402,403 of the thermally insulating material 417 are positioned at periodic locations along the exterior 418 of the device housing 410 that are just sufficient to maintain structural integrity of each instance 401,402,403 of the thermally insulating material 417.

Due to the combination of one or more of these elements, the conduction of heat from the exterior 418 of the device housing 410 to the user's skin is greatly impeded and only permitted to a fraction of the area of the skin that is touching the exterior 418 of the device housing 410. As a result, the user perceived temperature of the contacted surface is far lower than the actual temperature of the exterior 418 of the device housing 410. Advantageously, this allows the heat generating electronics 115 situated within the device housing to operate at significantly higher temperatures without the user feeling any discomfort when touching the electronic device 400.

Embodiments of the disclosure contemplate that the human body acts as a limited heat sink that can only absorb and/or dissipate a small amount of heat per unit area per unit time while still keeping the skin temperature stable (homeostasis). However, if the heat transferred to the skin is through a highly conductive material, the rate of heat absorbed by the skin is insufficient to keep the skin temperature (as perceived by the person) low. This is why, when touched, metal feels hotter (or colder if the temperature of the metal is lower than the skin temperature) than plastics at the same temperature. Embodiments of the disclosure take advantage of this by both reducing the thermal conduction and the surface area of contact between the skin and the exterior 418 of the device housing 410.

The instances 401,402,403 of the thermally insulating material 417 of FIG. 4 are configured as periodic hollow spheres situated along the exterior 418 of the device housing 410. The periodic spheres are used to minimize conduction from the exterior 418 of the device housing 410 while at the same time providing structural strength to these features.

Accordingly, embodiments of the disclosure provide a textured surface, surface treatment, or surface layer placed upon or integrated into the exterior 418 of the device housing 410 of an electronic device 400. In FIG. 4, placement of the instances 401,402,403 of the thermally insulating material 417 occurs at periodic locations. In one or more embodiments, the instances 401,402,403 of the thermally insulating material 417 reduce the fraction of a user's skin that touches surfaces of the exterior 418 of the device housing 410 to only a few percent.

In one or more embodiments, the effective thermal conductivity of the instances 401,402,403 of the thermally insulating material 417 is low due to the geometry and/or materials used. The limited contact area and low conduction path between, for example, a user's touching finger and the exterior 418 of the device housing 410 presents a cooler perceived surface for the user to touch.

Turning now to FIG. 6, illustrated therein illustrated therein is another electronic device 600 configured in accordance with embodiments of the disclosure. As before, the electronic device 600 comprises a device housing 610 with heat generating electronics (115) situated therein. A thermally insulating screen 616 of thermally insulating material 617 is positioned on an exterior 618 of the device housing 610. As before, the thermally insulating screen 616 defines a partition between the exterior 618 of the device housing 610 an external object contacting the electronic device 600 while allowing thermal energy (120) to dissipate through the device housing 610 between instances of the thermally insulating material 617.

In the illustrative embodiment of FIG. 6, the instances of the thermally insulating material 617 define a lattice. The instances of the thermally insulating material 617 define a lattice are attached to the exterior 618 of the device housing 610 by an adhesive or other coupling compound. In cross section, the instances of the thermally insulating material 617 defining the lattice are arched. While the instances of the thermally insulating material 617 defining the lattice are manufactured from a thermoplastic material, in the illustrative embodiment of FIG. 6 the thermoplastic material is a compressible thermoplastic material filled with foam that expands when a finger or other object contacts the same. The use of a compressible thermoplastic material for the instances of the thermally insulating material 617 defining the lattice allows for those instances to be positioned farther apart.

Figure 7:
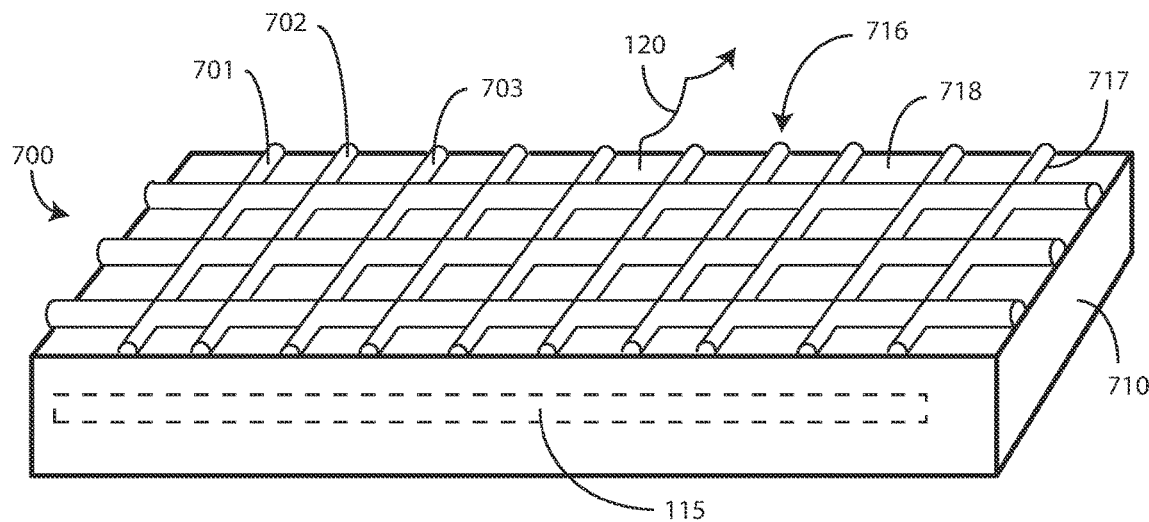
FIG. 7 illustrates a side elevation view of the device housing and screen of FIG. 6.

Turning now to FIG. 7, illustrated therein is yet another electronic device 700 configured in accordance with one or more embodiments of the disclosure. As with other embodiments, the electronic device 700 comprises a device housing 710 with heat generating electronics 115 situated therein. A thermally insulating screen 716 of thermally insulating material 717 is positioned on an exterior 718 of the device housing 710.

In this illustrative embodiment, the thermally insulating screen 716 of thermally insulating material 717 is only positioned on the rear major surface of the electronic device 700. The sides of the device housing 710 of the electronic device 700 include no instances of the thermally insulating material. The bottom of the electronic device 700 as shown in FIG. 7 is a major face defined by a display of the electronic device 700.

As before, the thermally insulating screen 716 defines a partition between the exterior 718 of the device housing 710 an external object contacting the electronic device 700 while allowing thermal energy 120 to dissipate through the device housing 710 between instances 701,702,703 of the thermally insulating material 717. In the illustrative embodiment of FIG. 7, the instances 701,702,703 of the thermally insulating material 717 comprise hollow structures positioned on the exterior 718 of the device housing 710.

In this illustrative embodiment, the instances 701,702,703 of the thermally insulating material 717 define a grille. As used herein, "grille" takes the ordinary, English definition of a "grating or screen of [thermally insulating material] placed in front of something as protection or to allow ventilation" as defined by the New Oxford American Dictionary. In this illustrative embodiment, each grating defined by each instance 701,702,703 defines an arched cross section defined by a hollow section of thermoplastic material. Moreover, each grating defined by each instance 701,702,703 is rigid. The instances 701,702,703 of the thermally insulating material 717 are positioned along the entirety of the rear surface of the device housing 710 in FIG. 7 and are situated atop the heat generating electronics 115.

The instances 701,702,703 of the thermally insulating material 717 of FIG. 7 make the perceived temperature when touching the electronic device 700 "feel" lower than the actual temperature of the device housing 710. Advantageously, this allows the heat generating electronics 115 situated within the electronic device 700 to operate at higher temperatures. In one or more embodiments, the instances 701,702,703 of the thermally insulating material 717 change the texture of the exterior 718 of the device housing 710 such that its temperature, when touched, is perceived to be lower than the actual temperature of the device housing 710 itself.

Figure 8:
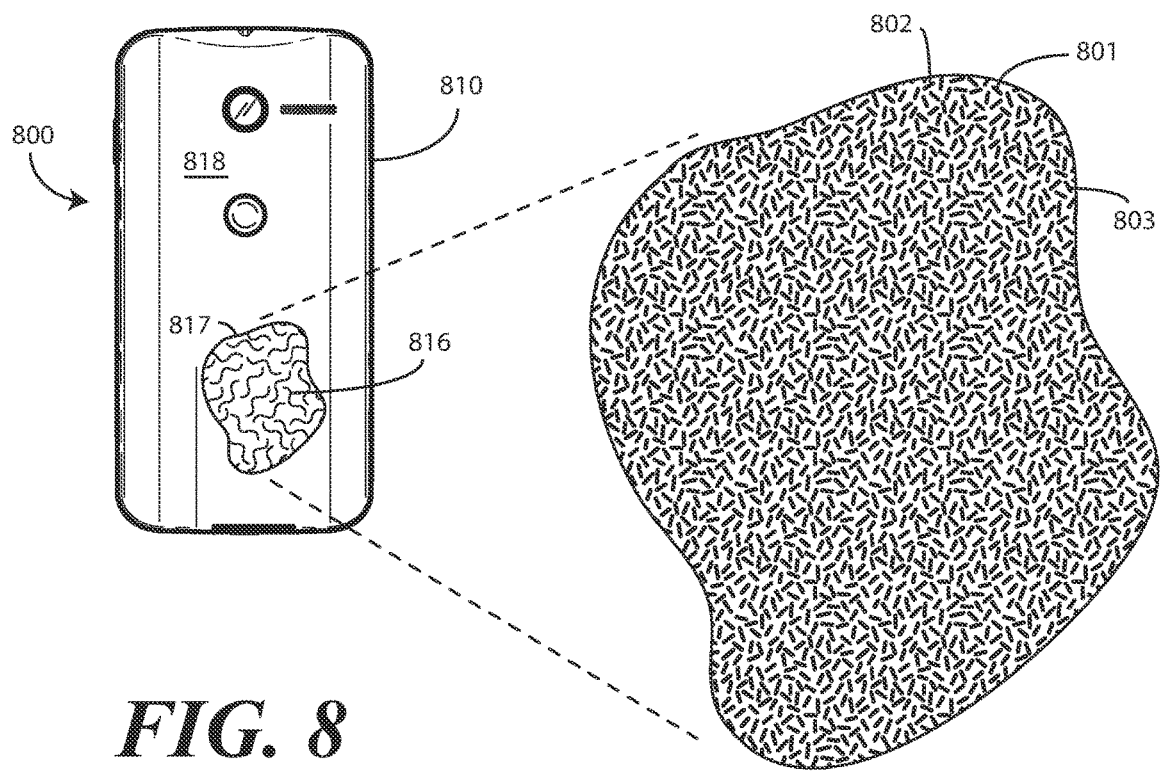
FIG. 8 illustrates another explanatory screen on an electronic device in accordance with one or more embodiments of the disclosure.
Figure 9:
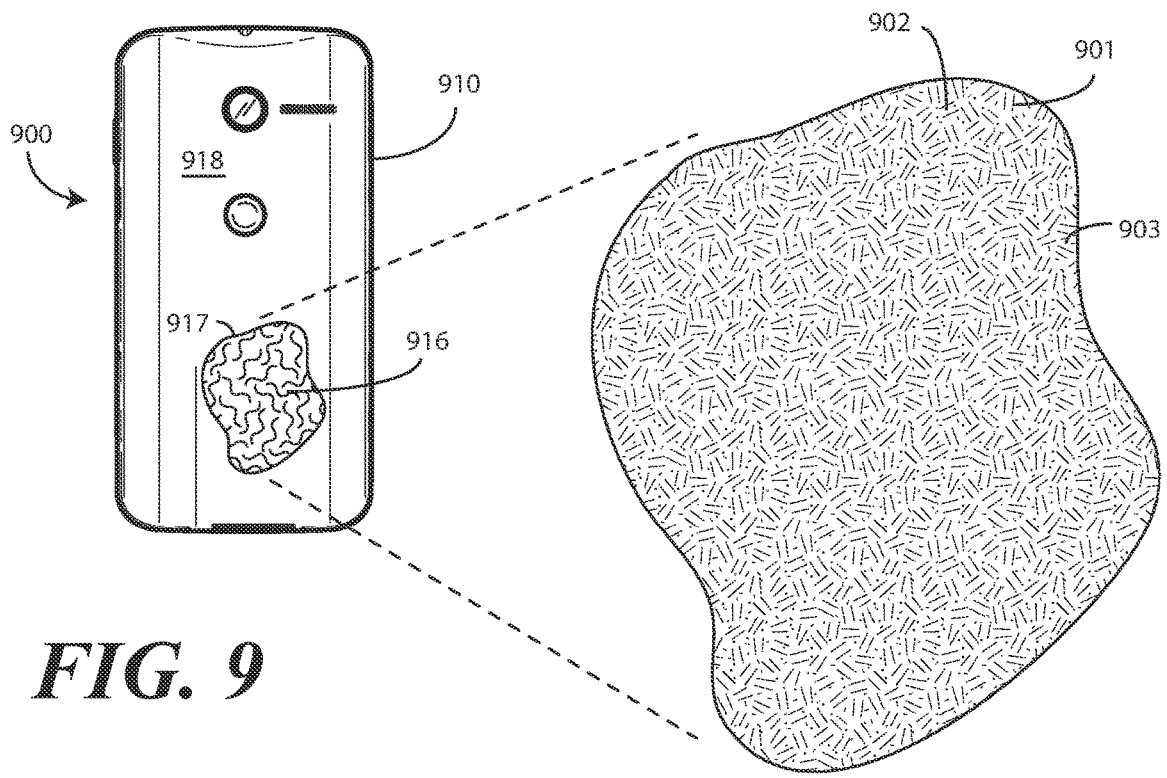
FIG. 9 illustrates yet another explanatory screen on an electronic device in accordance with one or more embodiments of the disclosure.

Turning now to FIG. 8, illustrated therein illustrated therein is another electronic device 800 configured in accordance with embodiments of the disclosure. As before, the electronic device 800 comprises a device housing 810 with heat generating electronics (115) situated therein. A thermally insulating screen 816 of thermally insulating material 817 is positioned on an exterior 818 of the device housing 810. As before, the thermally insulating screen 816 defines a partition between the exterior 818 of the device housing 810 an external object contacting the electronic device 800 while allowing thermal energy (120) to dissipate through the device housing 810 between instances of the thermally insulating material 817.

In the illustrative embodiment of FIG. 8, the instances 801,802,803 of the thermally insulating material 817 are randomly positioned upon the exterior 818 of the device housing 810. Additionally, rather than being mechanically attached to the exterior 818 of the device housing 810 as were other previously described embodiments, in FIG. 8 the instances 801,802,803 of the thermally insulating material 817 are integrated into the device housing 810. Illustrating by example, in one or more embodiments the instances 801,802,803 of the thermally insulating material 817 can be insert molded through apertures defining the perimeters of the instances 801,802,803 of the thermally insulating material 817 in the device housing 810.

In FIG. 8, rather than being spherical, configured as a lattice, or configured as a grille, the instances 801,802,803 of the thermally insulating material 817 are obround, thereby each defining a discorectangle. Moreover, the orientation of each discorectangle is altered from its neighbors, thereby increasing the randomness of the arrangement. The instances 801,802,803 of the thermally insulating material 817 are each solid instances of thermoplastic material and are rigid. The instances 801,802,803 of the thermally insulating material 817 have a combined height and density function configured to prevent more than ten percent of a finger contacting the instances 801,802,803 of the thermally insulating material 817 from contacting the exterior 818 of the device housing 810.

Turning now to FIG. 9, illustrated therein illustrated therein is another electronic device 900 configured in accordance with embodiments of the disclosure. As before, the electronic device 900 comprises a device housing 910 with heat generating electronics (115) situated therein. A thermally insulating screen 916 of thermally insulating material 917 is positioned on an exterior 918 of the device housing 910. As before, the thermally insulating screen 916 defines a partition between the exterior 918 of the device housing 910 an external object contacting the electronic device 900 while allowing thermal energy (120) to dissipate through the device housing 910 between instances of the thermally insulating material 917.

In the illustrative embodiment of FIG. 9, the instances 901,902,903 of the thermally insulating material 917 each comprise a thermoplastic material pair randomly positioned upon the exterior 918 of the device housing 910. Each thermoplastic material pair is non-parallel, thereby increasing the overall randomness of the thermally insulating screen 916. The instances 901,902,903 of the thermally insulating material 917 are mechanically attached to the exterior 918 of the device housing 910 by a thermal bonding process.

Turning now to FIG. 108, illustrated therein illustrated therein is another electronic device 1000 configured in accordance with embodiments of the disclosure. As before, the electronic device 1000 comprises a device housing 1010 with heat generating electronics (115) situated therein. A thermally insulating screen 1016 of thermally insulating material 1017 is positioned on an exterior 1018 of the device housing 1010. As before, the thermally insulating screen 1016 defines a partition between the exterior 1018 of the device housing 1010 an external object contacting the electronic device 1000 while allowing thermal energy (120) to dissipate through the device housing 1010 between instances of the thermally insulating material 1017.

Figure 10:
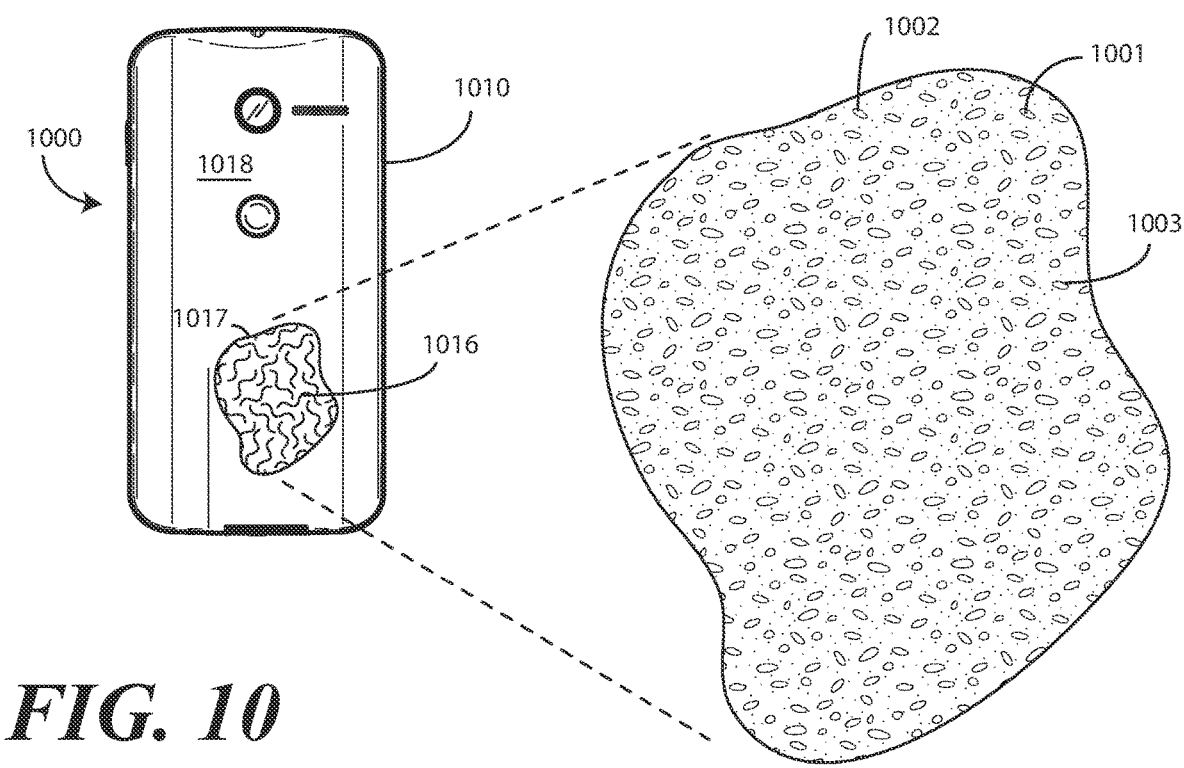
FIG. 10 illustrates still another explanatory screen on an electronic device in accordance with one or more embodiments of the disclosure.

In the illustrative embodiment of FIG. 10, the instances 1001,1002,1003 of the thermally insulating material 1017 are randomly positioned upon the exterior 1018 of the device housing 1010. The instances 1001,1002,1003 of the thermally insulating material 1017 can be mechanically attached to the device housing 1010 or alternatively integrated into the device housing 1010. Additionally, rather than being spherical, configured as a lattice, or configured as a grille, the instances 1001,1002,1003 of the thermally insulating material 1017 are ovular and have different sizes. Said differently, the perimeters of the instances 1001,1002, 1003 of the thermally insulating material 1017 have different lengths, thereby increasing the randomness of the arrangement.

The instances 1001,1002,1003 of the thermally insulating material 1017 are each solid instances of thermoplastic material and are compressible. The instances 1001,1002, 1003 of the thermally insulating material 1017 have a combined height and density function configured to prevent more than ten percent of a finger contacting the instances 1001,1002,1003 of the thermally insulating material 1017 from contacting the exterior 1018 of the device housing 1010.

Figure 11:
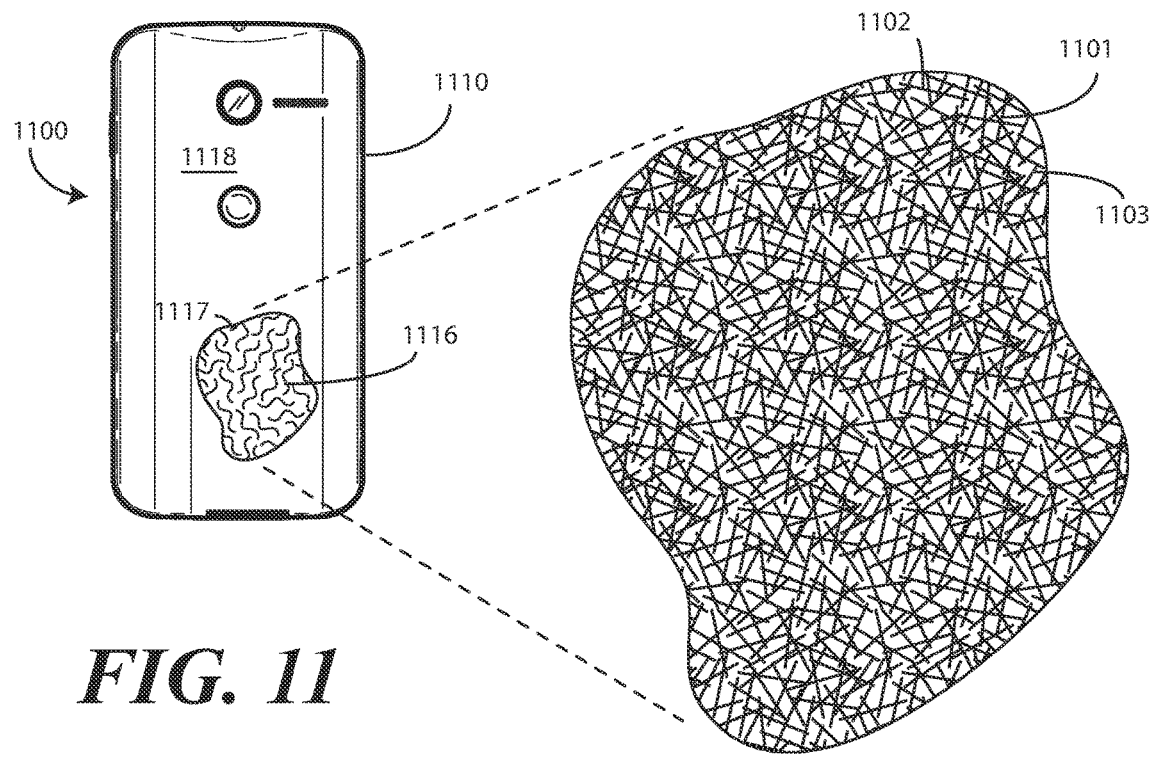
FIG. 11 illustrates another explanatory screen on an electronic device in accordance with one or more embodiments of the disclosure.

Turning now to FIG. 11, illustrated therein illustrated therein is another electronic device 1100 configured in accordance with embodiments of the disclosure. As before, the electronic device 1100 comprises a device housing 1110 with heat generating electronics (115) situated therein. A thermally insulating screen 1116 of thermally insulating material 1117 is positioned on an exterior 1118 of the device housing 1110. As before, the thermally insulating screen 1116 defines a partition between the exterior 1118 of the device housing 1110 an external object contacting the electronic device 1100 while allowing thermal energy (120) to dissipate through the device housing 1110 between instances of the thermally insulating material 1117.

In the illustrative embodiment of FIG. 11, the instances 1101,1102,1103 of the thermally insulating material 1117 are again randomly positioned upon the exterior 1118 of the device housing 110. Additionally, rather than being spherical, configured as a lattice, or configured as a grille, the instances 1101,1102,1103 of the thermally insulating material 1117 are configured as linear, intersecting segments that each define a mini-lattice and that, collectively, define a mesh of thermoplastic material. The instances 1101,1102, 1103 of the thermally insulating material 1117 are each hollow instances of thermoplastic material filled with an inert gas and are compressible. The instances 1101,1102, 1103 of the thermally insulating material 1117 have a combined height and density function configured to prevent more than ten percent of a finger contacting the instances 1101,1102,1103 of the thermally insulating material 1117 from contacting the exterior 1118 of the device housing 1110.

Figure 12:
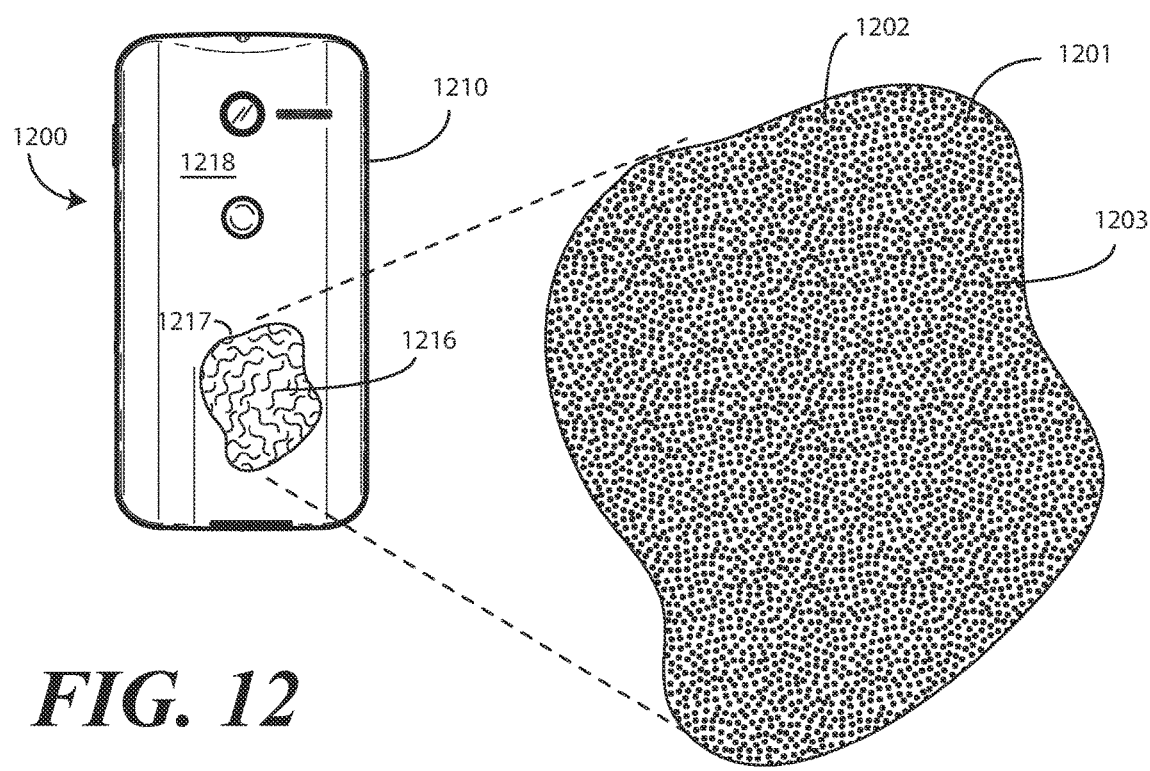
FIG. 12 illustrates still another explanatory screen on an electronic device in accordance with one or more embodiments of the disclosure.

Turning now to FIG. 12, illustrated therein illustrated therein is another electronic device 1200 configured in accordance with embodiments of the disclosure. As before, the electronic device 1200 comprises a device housing 1210 with heat generating electronics (115) situated therein. A thermally insulating screen 1216 of thermally insulating material 1217 is positioned on an exterior 1218 of the device housing 1210. As before, the thermally insulating screen 1216 defines a partition between the exterior 1218 of the device housing 1210 an external object contacting the electronic device 1200 while allowing thermal energy (120) to dissipate through the device housing 1210 between instances of the thermally insulating material 1217.

In the illustrative embodiment of FIG. 12, the instances 1201,1202,1203 of the thermally insulating material 1217 are randomly positioned upon the exterior 1218 of the device housing 1210. In this illustrative embodiment, the instances 1101,1102,1103 of the thermally insulating material 1117 comprises hollow structures positioned on the exterior 1218 of the device housing 1210. The instances 1101,1102,1103 of the thermally insulating material 1117 have a density exposing less than ten percent of the exterior of the device housing 1210 where the instances 1101,1102, 1103 of the thermally insulating material 1117 per each 0.2 square inches. The instances 1101,1102,1103 of the thermally insulating material 1117 are manufactured from fiberglass and are integrated into the device housing 1210. Each instance 1101,1102,1103 of the thermally insulating material 1117 defines a partial sphere, although other shapes will be obvious to those of ordinary skill in the art having the benefit of this disclosure.

Figure 13:
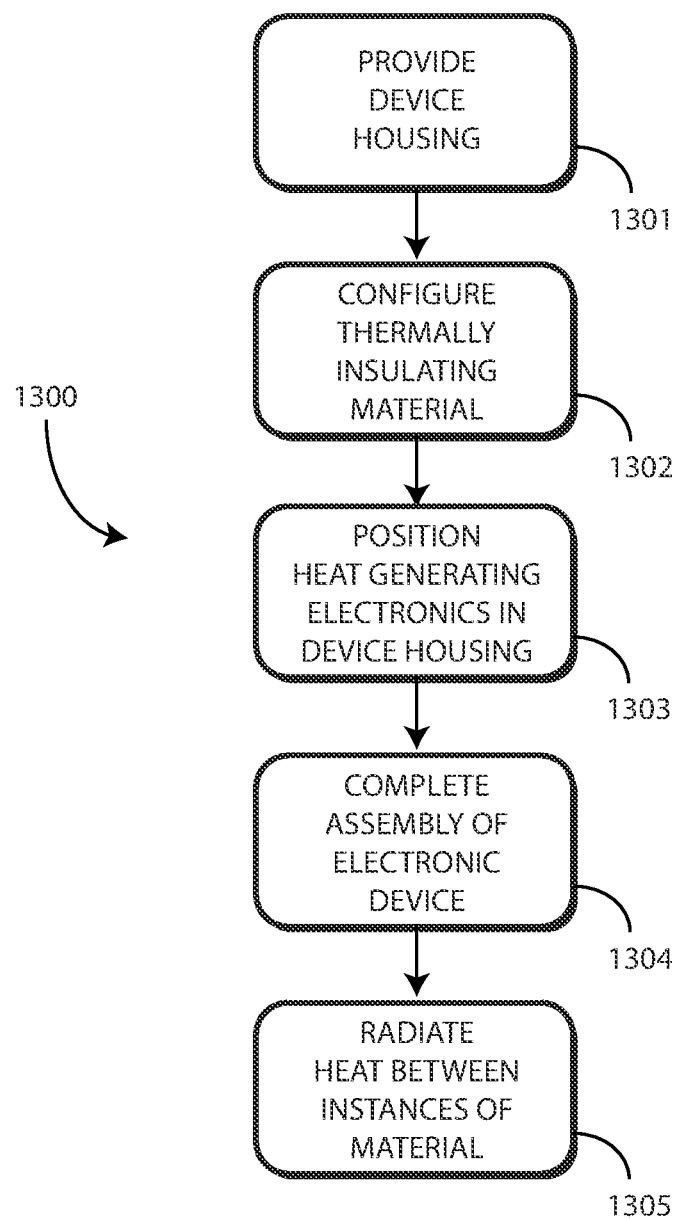
FIG. 13 illustrates one explanatory method in accordance with one or more embodiments of the disclosure.

Turning now to FIG. 13, illustrated therein is one explanatory method 1300 in accordance with one or more embodiments of the disclosure. The method 1300 configures a device housing with a thermally insulating screen defined by a thermally insulating material occurring in instances along an exterior of the device housing of the electronic device. The thermally insulating material, which could be hollow, solid, or gas filled, and which could be a thermoplastic material, fiberglass, wool, cellulose, or other material, precludes more than ten percent of an object contacting the electronic device form touching the exterior of the electronic device.

Beginning at step 1301, the method 1300 provides a device housing. At step 1302, the device housing is configured with a thermally insulating screen defined by a thermally insulating material occurring in instances along an exterior of the device housing. At step 1302, the thermally insulating material precludes more than ten percent of an object contacting the electronic device from touching the exterior of the device housing of the electronic device.

Figure 14:
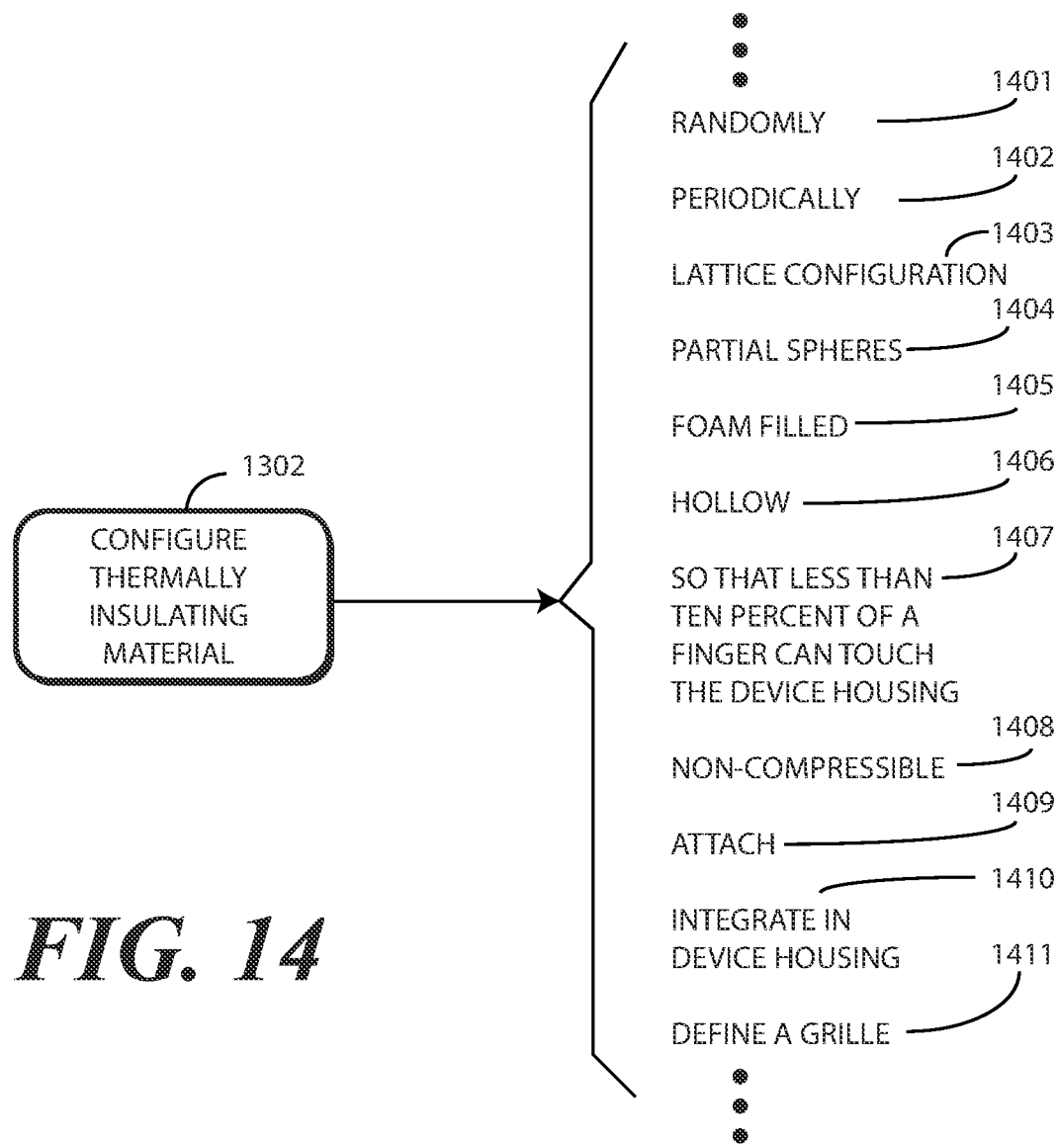
FIG. 14 illustrates one or more method steps in accordance with one or more embodiments of the disclosure.

Turning briefly to FIG. 14, illustrated therein are several ways that step 1302 can occur. It should be noted that these ways can be used alone or in combination unless they are mutually exclusive.

In one or more embodiments, the configuring of the device housing with the thermally insulating screen defined by the thermally insulating material occurring in the instances along the exterior of the device housing at step 1302 comprises randomly positioning 1401 those instances of the thermally insulating material. Said differently, in one or more embodiments the configuring of the device housing with the thermally insulating screen defined by the thermally insulating material occurring in the instances along the exterior of the device housing at step 1302 comprises attaching the instances of the thermally insulating material at random locations along the device housing of the electronic device.

In another embodiment, the configuring of the device housing with the thermally insulating screen defined by the thermally insulating material occurring in the instances along the exterior of the device housing at step 1302 comprises periodically positioning 1402 those instances of the thermally insulating material. In one or more embodiments, one or more embodiments the configuring of the device housing with the thermally insulating screen defined by the thermally insulating material occurring in the instances along the exterior of the device housing at step 1302 comprises periodically positioning 1402 a plurality of non-compressible, hollow, thermoplastic partial spheres along an exterior of the device housing of the electronic device.

In another embodiment, the configuring of the device housing with the thermally insulating screen defined by the thermally insulating material occurring in the instances along the exterior of the device housing at step 1302 comprises configuring the instances of the thermally insulating material in a lattice configuration 1403. In other embodiments, the configuring of the device housing with the thermally insulating screen defined by the thermally insulating material occurring in the instances along the exterior of the device housing at step 1302 comprises configuring the instances of the thermally insulating material as partial spheres 1404.

In still other embodiments, the configuring of the device housing with the thermally insulating screen defined by the thermally insulating material occurring in the instances along the exterior of the device housing at step 1302 comprises creating hollow instances 1405 of the thermally insulating material. In other embodiments, the configuring of the device housing with the thermally insulating screen defined by the thermally insulating material occurring in the instances along the exterior of the device housing at step 1302 comprises creating foam-filled structures 1406 that serve as the instances of the thermally insulating material.

In one or more embodiments, the configuring of the device housing with the thermally insulating screen defined by the thermally insulating material occurring in the instances along the exterior of the device housing at step 1302 comprises positioning the instances of the thermally insulating material with a combined height and density function 1407 configured to prevent more than ten percent of a finger contacting the instances of the thermally insulating material from contacting the exterior of the device housing of the electronic device. In one or more embodiments, the configuring of the device housing with the thermally insulating screen defined by the thermally insulating material occurring in the instances along the exterior of the device housing at step 1302 comprises making the instances of the thermally insulating material non-compressible 1408.

In one or more embodiments, the configuring of the device housing with the thermally insulating screen defined by the thermally insulating material occurring in the instances along the exterior of the device housing at step 1302 comprises mechanically attaching 1409 the instances of the thermally insulating material to the exterior of the device housing of the electronic device. In other embodiments, the configuring of the device housing with the thermally insulating screen defined by the thermally insulating material occurring in the instances along the exterior of the device housing at step 1302 comprises integrating 1410 the instances of the thermally insulating material into the device housing so that the instances of the thermally insulating material and device housing form a single, unitary part.

In one or more embodiments, the configuring of the device housing with the thermally insulating screen defined by the thermally insulating material occurring in the instances along the exterior of the device housing at step 1302 comprises causing the instances of the thermally insulating material to define a grille 1411. As noted above, these ways of creating the instances of the thermally insulating material can be used in any combination unless mutually exclusive. For instance, making the instances of the thermally insulating material hollow structures 1405 and foam-filled structures 1406 at the same time would be mutually exclusive, while positioning the instances of the thermally insulating material randomly as hollow, compressible structures that are mechanically attached to the device housing of the electronic device would be appropriate.

Turning now back to FIG. 13, at step 1303 heat generating electronics are positioned within the device housing provided at step 1301. At step 1304, construction of the electronic device is completed. Illustrating by example, a display may be attached and so forth.

At step 1305, thermal energy from the heat generating electronics is radiated between the instances of the thermally insulating material while less than ten percent of a finger is allowed to touch exterior surfaces of the device housing due to the inclusion of the thermally insulating screen. Advantageously, this allows the heat generating electronics to run hotter without the user even knowing due to the fact that the overall electronic device still feels cool.

Figure 15:
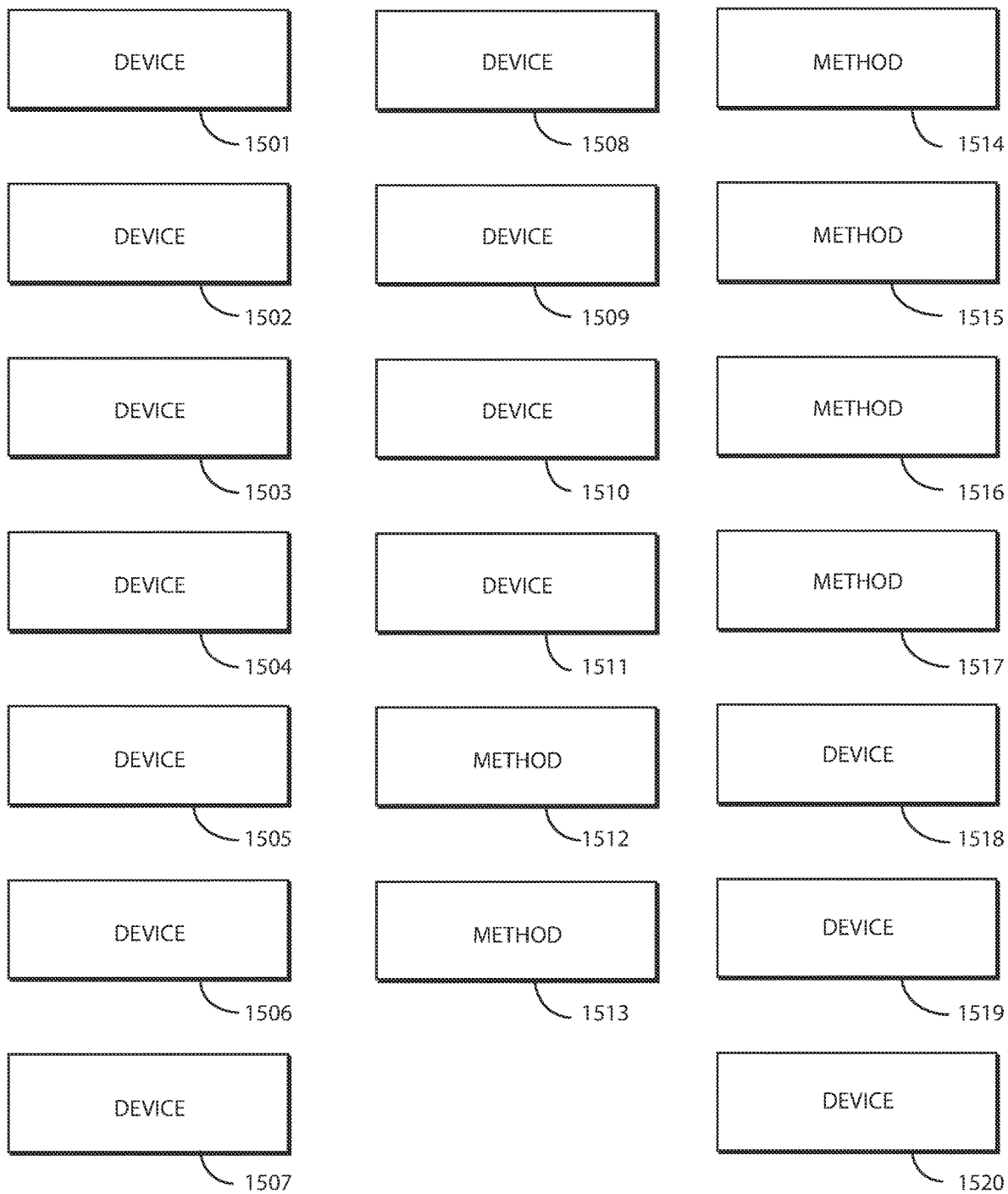
FIG. 15 illustrates various embodiments of the disclosure.

Turning now to FIG. 15, illustrated therein are various embodiments of the disclosure. The embodiments of FIG. 15 are shown as labeled boxes in FIG. 15 due to the fact that the individual components of these embodiments have been illustrated in detail in FIGS. 1-14, which precede FIG. 15. Accordingly, since these items have previously been illustrated and described, their repeated illustration is no longer essential for a proper understanding of these embodiments. Thus, the embodiments are shown as labeled boxes for succinctness.

At 1501, an electronic device comprises a device housing and heat generating electronics situated within the device housing. At 1501, the electronic device comprises a thermally insulating screen defined by thermally insulating material positioned on an exterior of the device housing. At 1501, the thermally insulating screen defines a partition between the exterior of the device housing and external objects contacting the electronic device while allowing thermal energy from the heat generating electronics to dissipate through the device housing between instances of the thermally insulating material.

At 1502, the instances of the thermally insulating material of 1501 comprise hollow structures positioned on the exterior of the device housing. At 1503, the instances of the thermally insulating material of 1501 comprise foam-filled structures.

At 1504, the thermally insulating material of 1501 comprises a thermoplastic material. At 1505, the instances of the thermally insulating material of 1501 are periodically positioned upon the exterior of the device housing. At 1506, the instances of the thermally insulating material of 1501 are randomly positioned upon the exterior of the device housing.

At 1507, the instances of the thermally insulating material of 1501 have a density exposing less than ten percent of the exterior of the device housing per 0.2 square inches. At 1508, the instances of the thermally insulating material of 1507 define a grille. At 1509, each grating of the grille of 1508 defines an arched cross section. At 1510, the instances of the thermally insulating material of 1507 each define partial spheres. At 1511, the instances of the thermally insulating material of 1507 are integrated into the device housing.

At 1512, a method for an electronic device comprises configuring a device housing of the electronic device with a thermally insulating screen defined by thermally insulating material occurring in instances along an exterior of the device housing. At 1512, the thermally insulating material precludes more than ten percent of an object contacting the electronic device from touching the exterior of the electronic device. At 1513, the method of 1512 further comprises radiating thermal energy from one or more heat generating electronics situated within the device housing between the instances of the thermally insulating material.

At 1514, the configuring of 1513 comprises attaching the instances of the thermally insulating material at random locations along the exterior of the device housing. At 1515, the configuring of 1513 comprises attaching the instances of thermally insulating material at only select locations along the exterior of the device housing that correspond to locations of the one or more heat generating electronics.

At 1516, the configuring of 1513 comprises defining a grille of foam-filled partial arch lengths of thermoplastic. At 1517, the configuring of 1513 comprises periodically positioning a plurality of non-compressible, hollow, thermoplastic partial spheres along the exterior of the device housing.

At 1518, an electronic device comprises a device housing and heat generating electronics situated within the device housing. At 1518, the electronic device comprises instances of a thermally insulating material positioned on an exterior of the device housing with a combined height and density function configured to prevent more than ten percent of a finger contacting the instances of thermally insulating material from contacting the exterior of the device housing.

At 1519, the instances of the thermally insulating material of 1518 are rigid and randomly positioned. At 1520, the instances of the thermally insulating material of 1518 define a lattice.

In the foregoing specification, specific embodiments of the present disclosure have been described. However, one of ordinary skill in the art appreciates that various modifications and changes can be made without departing from the scope of the present disclosure as set forth in the claims below. Thus, while preferred embodiments of the disclosure have been illustrated and described, it is clear that the disclosure is not so limited. Numerous modifications, changes, variations, substitutions, and equivalents will occur to those skilled in the art without departing from the spirit and scope of the present disclosure as defined by the following claims.

Accordingly, the specification and figures are to be regarded in an illustrative rather than a restrictive sense, and all such modifications are intended to be included within the scope of present disclosure. The benefits, advantages, solutions to problems, and any element(s) that may cause any benefit, advantage, or solution to occur or become more pronounced are not to be construed as a critical, required, or essential features or elements of any or all the claims.

What is claimed is:

1. An electronic device, comprising:
a device housing;
heat generating electronics situated within the device housing; and
a thermally insulating screen defined by a thermally insulating material positioned on an exterior of the device housing, the thermally insulating screen defining a partition between the exterior of the device housing and external objects contacting the electronic device while allowing thermal energy from the heat generating electronics to dissipate through the device housing between discontinuous instances of the thermally insulating material exposing portions of an exterior of the device housing between the discontinuous instances.

2. The electronic device of claim 1, wherein the discontinuous instances of the thermally insulating material comprise hollow structures positioned on the exterior of the device housing.

3. The electronic device of claim 1, wherein the discontinuous instances of the thermally insulating material comprise foam-filled structures.

4. The electronic device of claim 1, wherein the thermally insulating material comprises a thermoplastic material.

5. The electronic device of claim 1, wherein the discontinuous instances of the thermally insulating material are periodically positioned upon the exterior of the device housing.

6. The electronic device of claim 1, wherein the discontinuous instances of the thermally insulating material are randomly positioned upon the exterior of the device housing.

7. The electronic device of claim 1, wherein the discontinuous instances of the thermally insulating material have a density exposing less than ten percent of the exterior of the device housing per 0.2 square inches.

8. The electronic device of claim 7, wherein the discontinuous instances of the thermally insulating material define a grille.

9. The electronic device of claim 8, wherein each grating of the grille defines an arched cross section.

10. The electronic device of claim 7, wherein the discontinuous instances of the thermally insulating material each define partial spheres.

11. The electronic device of claim 7, wherein the discontinuous instances of the thermally insulating material are integrated into the device housing.

12. A method for an electronic device, the method comprising configuring a device housing of the electronic device with a thermally insulating screen defined by a thermally insulating material occurring in instances along an exterior of the device housing and defining a grille of foam-filled partial arch lengths of thermoplastic, the thermally insulating material precluding more than ten percent of an object contacting the electronic device from touching the exterior of the electronic device.

13. The method of claim 12, further comprising radiating thermal energy from one or more heat generating electronics situated within the device housing between the instances of the thermally insulating material.

14. The method of claim 13, wherein the configuring comprises attaching the instances of the thermally insulating material at random locations along the exterior of the device housing.

15. The method of claim 13, wherein the configuring comprises attaching the instances of thermally insulating material at only select locations along the exterior of the device housing that correspond to locations of the one or more heat generating electronics.

16. The method of claim 13, wherein the grille is configured as a grating allowing ventilation from exposed portions of an exterior surface of the device housing.

17. The method of claim 13, wherein the configuring comprises periodically positioning the foam-filled partial arch lengths of the thermoplastic along the exterior of the device housing.

18. An electronic device, comprising:
a device housing;
heat generating electronics situated within the device housing; and
instances of a thermally insulating material positioned on an exterior of the device housing with a combined height and density function configured to prevent more than ten percent of a finger contacting the instances of thermally insulating material from contacting the exterior of the device housing;
wherein the instances of the thermally insulating material define a lattice.

19. The electronic device of claim 18, wherein the instances of the thermally insulating material are rigid and randomly positioned.

20. The electronic device of claim 18, wherein the instances of the thermally insulating material are configured as linear, intersecting segments that each define a mini-lattice.

* * * * *